United States Patent [19]

Shirato

[11] Patent Number: 4,720,737

[45] Date of Patent: Jan. 19, 1988

[54] SEMICONDUCTOR DEVICE HAVING A PROTECTION CIRCUIT WITH LATERAL BIPOLAR TRANSISTOR

[75] Inventor: Takehide Shirato, Hiratsuka, Japan

[73] Assignee: Fujitsu Limited, Kawasaki, Japan

[21] Appl. No.: 943,867

[22] Filed: Dec. 22, 1986

[30] Foreign Application Priority Data

Jun. 30, 1983 [JP]  Japan ................. 58-119083

[51] Int. Cl.[4] ............................. H01L 29/78
[52] U.S. Cl. .................. 357/23.13; 357/13; 357/35; 357/43; 357/51; 365/56; 365/91
[58] Field of Search ............... 357/23.13, 13, 35, 43, 357/51; 365/56, 91

[56] References Cited

U.S. PATENT DOCUMENTS

| | | | |
|---|---|---|---|
| 3,673,428 | 6/1972 | Athanas | 357/23.13 |
| 3,754,171 | 8/1973 | Anzai et al. | |
| 4,062,039 | 12/1977 | Nishimura . | |
| 4,476,476 | 10/1984 | Yu et al. | 357/13 |
| 4,503,448 | 3/1985 | Miyasaka | 357/23.13 |
| 4,509,067 | 4/1985 | Minami et al. | 357/41 |

FOREIGN PATENT DOCUMENTS

| | | |
|---|---|---|
| 43284 | 1/1982 | European Pat. Off. ......... 357/23.13 |
| 0055552 | 7/1982 | European Pat. Off. . |
| 0058557 | 8/1982 | European Pat. Off. . |
| 2722892 | 8/1977 | Fed. Rep. of Germany . |
| 54-140480 | 10/1979 | Japan ................. 357/23.13 |
| 56-138953 | 10/1981 | Japan ................. 357/23.13 |
| 57-190359 | 11/1982 | Japan ................. 357/23.13 |
| 57-190360 | 11/1982 | Japan ................. 357/23.13 |
| 59-52866 | 3/1984 | Japan ................. 357/23.13 |

OTHER PUBLICATIONS

M. Battista et al., "Fabrication of a Bilevel Clamp", IBM Tech. Discl. Bull., vol. 19, #6, Nov. 1976, pp. 2086-2087.

*Primary Examiner*—Joseph E. Clawson, Jr.
*Attorney, Agent, or Firm*—Staas & Halsey

[57] ABSTRACT

A protection circuit for inner elements such as metal insulator semiconductor (MIS) field effect transistors in a semiconductor device of high packing density has been improved. The protection circuit comprises protective elements of two types. One type has a deep diffusion region providing the element with high surge capacity, that is an ability to withstand the energy of an incoming surge, and the other type has a shallow diffusion region providing a low breakdown voltage. With a combination of these two types of protective element, the protection circuit can withstand high energy of an input surge and, at the same time, provide a low protection voltage suitable to protect the inner elements from breakdown.

15 Claims, 8 Drawing Figures

SEMICONDUCTOR DEVICE HAVING A PROTECTION CIRCUIT WITH LATERAL BIPOLAR TRANSISTOR

This is a continuation of copending application Ser. No. 625,684 filed on June 28, 1984.

BACKGROUND OF THE INVENTION

The present invention relates to a semiconductor device having a protection circuit to prevent the device from destruction due to excess voltage induced by electric surge or pulse noise. It particularly relates to a protection circuit having an ability to withstand excess input voltage, while still providing the inner elements of the device to be protected with a suitably low protection voltage.

In a semiconductor device, to improve its realiability, a protection circuit having protective elements such as semiconductor diodes is formed together with the inner elements such as MOS FETs (metal oxide semiconductor type field effect transistors) on the semiconductor substrate. The protection circuit prevents inner elements from being destroyed due to high voltage derived from an external noise pulse, contact with a charged human body, etc. Since the ICs (integrated circuits), such as memory ICs, have made remarkable progress in integration and high speed information processing ability, the structure of the elements formed in the IC becomes fine and delicate.

Particularly, an insulating layer under the gate electrode of a MOS FET formed in the device is so thin that it is often broken down by the applied electric field from a relatively small amount of electric charge supplied by an exterior source, such as by a charged human body.

In addition, the size and depth of the impurity regions of the inner elements have become smaller with the progress mentioned above. This tends to further reduce the capability of the protective elements formed in the device to withstand the excess voltage.

An impurity region of an element of a semiconductor device is usually formed by diffusing an impurity material (dopant) into a specified region in a substrate, which is referred to as a "diffusion region" in the following. The protection circuit elements also have diffusion regions, which are formed in the same diffusion process for forming the inner elements, so that the depth of the diffusion regions for the protection elements is the same as the depth of the diffusion regions of the inner elements.

Generally, in reverse-biased semiconductor rectifiers, such as diodes, diode-connected transistors, etc., the breakdown voltage decreases as the depth of the diffusion region becomes shallower. The breakdown voltage is defined as a voltage at which a reverse-biased p-n junction ceases to have sufficient impedance. Usually, the impurity region formed by a thermal diffusion process has a side wall with a radius of curvature $r_i$ (when the side wall is seen in cross-section). This radius $r_i$ is almost equal to the diffusion depth. So the deeper diffusion region has a larger radius of curvature along the boundary of the region. A large radius reduces the concentration of the electric field, resulting in an increased breakdown voltage of the element.

When the reverse current at the breakdown voltage exceeds a critical value, the junction of the diode will be melted and damaged locally at a portion where the current concentrates. The energy initiating the damage of the junction is defined herein as the "burn-out energy" of the diode. A large radius of curvature $r_i$ of the side wall of the diffusion region also causes the concentration of the diode current to decrease, resulting in a relatively uniform distribution of heat generation at the junction. Therefore the burn-out energy increases with the depth of the diffusion region.

The term "surge capacity" is defined herein as the ability of a diode to withstand the voltage or current transients in excess of its normal rating. The surge capacity is influenced by many factors, but the burn-out energy plays a main role. Thus, increasing the burn-out energy of a protective element is regarded as equivalent to improving its surge capacity.

From this point of view, a semiconductor device having protection elements with a deeper diffusion region than that of the inner elements was proposed by T. Yamanaka in TOKUGAN SHO55-11864 filed in the Japanese Patent Office in 1980. Therein, the elements in the protection circuit of the device are expected to have a higher burn-out energy and an increased surge capacity. But, as a result, the breakdown voltage itself goes up, as described above. This is not desirable for protecting the inner elements of the device, since a higher voltage is provided to the inner elements as the breakdown voltage of the protective element goes up.

As stated before, the depth of the diffusion region of the protective elements is required to be thinner to provide the lower protection voltage. This means that there are conflicting requirements for a protective element of the protection circuit, that is, between realizing a higher surge capacity while at the same time reducing or maintaining the protection voltage. Therefore, the protective elements of the above prior art are becoming increasingly unsatisfactory for protection circuits.

Semiconductor elements for large output are usually provided and, generally, the output terminals are connected to the diffusion regions of such elements, so that the elements themselves act as protective diodes. Therefore no special protection circuits have been arranged for the output circuits. In addition, in an output circuit, a diffusion region for a resistor is generally not provided, in order to avoid reduction of the output level. But in a circuit with high output voltage, such as a driving circuit for fluorescent display tubes, some protecting means for protecting the inner elements becomes necessary.

Recently, an input/output terminal for both input and output has become frequently used in a one-chip microcomputer or other IC device. In such a device, a protection circuit for the output circuit is also necessary, in order to assure reliability of the IC device.

SUMMARY OF THE INVENTION

It is an object of the present invention to provide a semiconductor device having highly integrated inner elements, such as a MOS FET, with an improved protection circuit.

Another object of the present invention is to provide a semiconductor device with a protection circuit for inner elements, having a low protection voltage which is sufficient to protect the inner elements, and a higher surge capacity (burn-out energy) that is sufficient to withstand a relatively high energy input surge, such as an electrical surge, an electrostatic charge from a human body, etc.

The foregoing objects are attained in the following way. A protection circuit is formed in a conventional semiconductor device such as an IC memory having inner elements, for example, metal-oxide-semiconductor field effect transistors (MOS FETs). The protection circuit comprises elements of two types, the first type having a relatively deep diffusion region to provide a higher surge capacity to withstand high current pulses, and the other type having a relatively shallow diffusion region, which is the same depth or shallower than that of the inner elements, to provide a sufficiently low protection voltage to protect the inner elements.

In the IC device, an input terminal, an output terminal, or an input/output terminal used for both input and output, the first type of protective element, the second type of protective element and the inner elements to be protected are positioned in series in this order. Usually, the protective elements are formed of a junction diode and a lateral transistor, which are connected electrically so as to bypass an excess voltage applied to a terminal of the device to ground via the protective elements.

An electric charge or an electrical surge applied to the terminal of the device usually has a pulse form of short duration. It charges up and raises the reverse voltage applied to the first type protection circuit element, but the rising voltage is clamped by the breakdown of the diode, thus discharging most of the input electrical charge to ground. The burn-out energy of the diode of the first type of protection element is large enough to withstand the input energy applied to the diode, thus resulting in no burn-out destruction of the diode.

Generally, the first protective element (diode) and the adjacent wiring have parasitic capacitance. The terminal is connected at one point of the diffusion region of the first protective element, and the diffusion region is connected at another point to the collector terminal of the second protection element (lateral transistor). Thus, the diffusion region works as a resistor between the terminal and the collector of the lateral transistor. The parasitic capacitance and the resistivity of the diffusion region form a C-R network, which reduces the peak voltage and provides a time delay of the shock to the second protective element. During this time delay, most of the applied pulse energy is discharged, and the current applied to the second protective element decreases. This prevents destructive burn-out of the second protective elements.

Thus the excess voltage of a pulse applied to the terminal of the IC device is discharged by the first protective element and is clamped to a specified low voltage by the second protective element. The protection circuit accordingly has a strong ability to withstand the excess energy of the incoming pulse, resulting in enhancement of the reliablity of the device.

The preferred embodiments according to the present invention will be described hereunder, with reference to the accompanying drawings.

BRIEF DESCRIPTION OF THE DRAWINGS

FIG. 3(a) illustrates a partial structure of the IC device after the field oxide layer and the channel cut have been formed.

FIG. 3(b) illustrates a partial structure of the IC device after the gate oxide layer has been formed.

FIG. 3(c) illustrates a partial structure of the IC device after the gate electrode of the FET has been formed.

FIG. 3(d) illustrates a partial structure of the IC device after a photoresist layer has been formed and a dopant for the diffusion region of the first protective element has been implanted.

FIG. 3(e) illustrates a partial structure of the IC device after the formation of a phospho-silicate glass layer.

FIG. 3(f) illustrates a partial structure of the IC device after an aluminum interconnecting layer has been patterned to form the circuit wiring.

DESCRIPTION OF THE PREFERRED EMBODIMENTS

Figure 1:
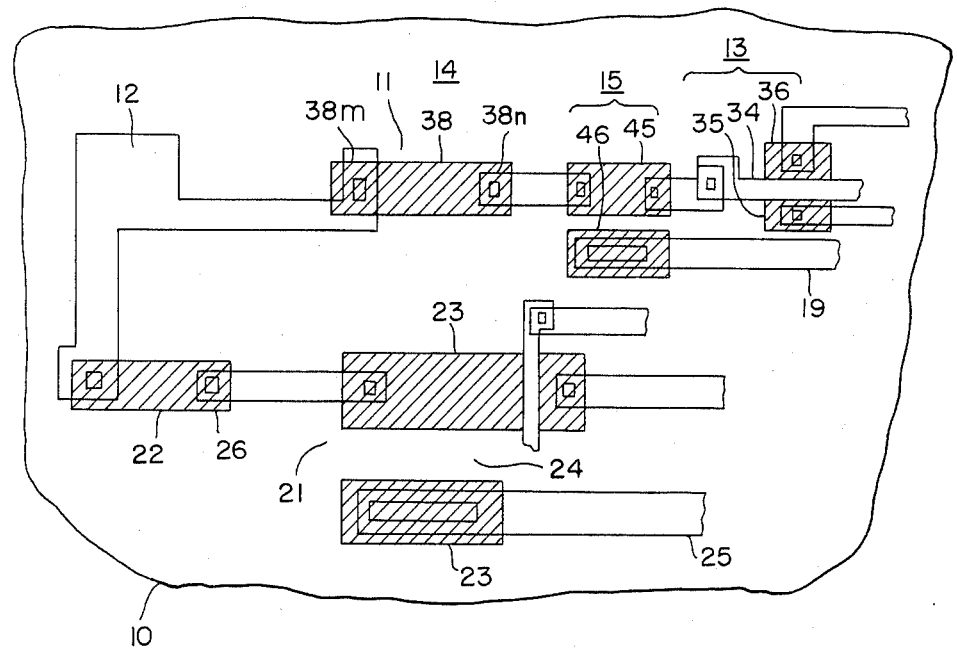
FIG. 1 illustrates schematically a plan view of a semiconductor device according to the present invention.
Figure 2:
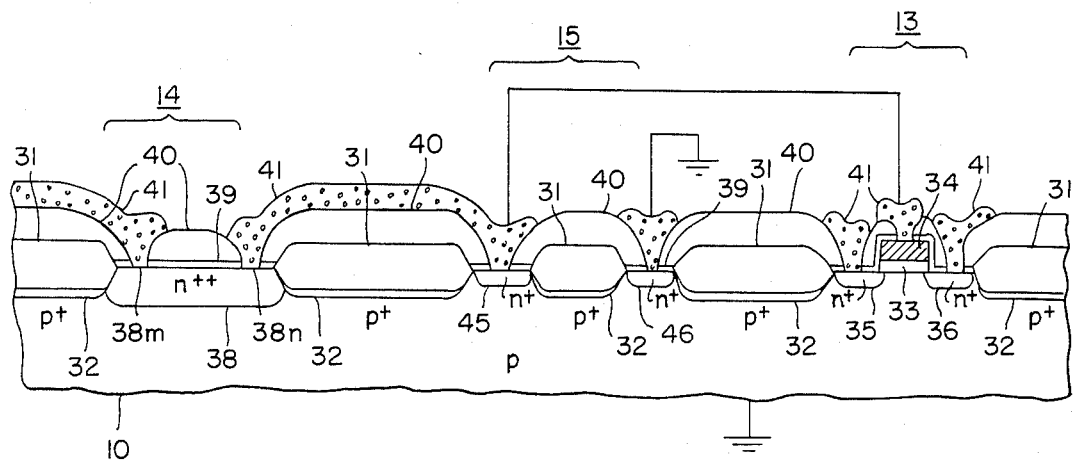
FIG. 2 illustrates schematically a cross-sectional view of the semiconductor device shown in FIG. 1.

The plan view of an embodiment is illustrated in FIG. 1, and its schematic cross-sectional view is illustrated in FIG. 2. On a p-type silicon substrate 10 having a resistivity of around 20 $\Omega$ cm, the inner elements 13 for the input circuit, usually MOS FETs, are formed with shallow diffusion regions (source region 35 and drain region 36). Between the input/output terminal 12 and the gate electrode 34 of the inner element 13, an input protection circuit is arranged comprising a first protective element 14 having a deep diffusion region 38 and a second protective element 15, for a lateral transistor, having shallow diffusion regions, a collector region 45 and an emitter region 46. In comparison with the diffusion regions 35 and 36 of the inner element 13, the diffusion region 38 is relatively deeper while the diffusion regions 45 and 46 have approximately the same depth.

The first protection element 14 has a n-p junction formed by the n-type diffusion region 38 and the p-type substrate 10, and acts as a diode having a breakdown voltage $V_{b1}$. An interconnecting means for the wiring of the circuit, usually an aluminum interconnecting layer 41, is disposed on an insulating layer 40, which is usually a phosphorus silicate glass (PSG) layer formed on the device.

The second protective element 15 is an n-p-n type lateral transistor comprising separated n-type diffusion regions 45 (for the collector) and 46 (for the emitter) and a p-type substrate 10 (for the base). As described before, the first protective element 14 having a deep diffusion region 38 has a strong ability to withstand a surge of current (energy), but its breakdown voltage $V_{b1}$ is relatively high, and such a high voltage cannot be applied to the inner element 13 directly. The surge voltage clamped by the first protective element should be reduced below the specified voltage before it is applied to the second protective element 15 which has low surge capacity.

The input/output terminal 12 is connected with the aluminum interconnecting layer 41 at a point 38m of the diffusion region 38. The other point 38n of the diffusion region 38 is connected to the diffusion region 45, that is, to the collector of the lateral transistor 15, so that the resistance of the diffusion region 38 (around 1 K$\Omega$ for instance) is inserted between the input/output terminal 12 and the lateral transistor 15. The n-p junction formed by the diffusion region 38 and the substrate 10 has a large parasitic capacity, such as 3 pF. The collector 45 is connected to the gate electrode 34 of the MOS FET 13 (the connecting path is indicated in FIG. 2 and shown in FIG. 1), and the substrate 10 and the other diffusion region 46 (emitter of the transistor 15) are grounded.

Therefore, the applied surge voltage is clamped to the breakdown voltage $V_{b2}$ of the lateral transistor 15 having shallow diffusion regions when it reaches the gate electrode 34 of the inner element. The voltage $V_{b2}$ is low enough to prevent the gate insulator 33 of the MOS FET 13 from destruction, but the burn-out energy of the transistor 15 is small and it cannot withstand a high surge; in other words, the surge capacity of the transistor 15 is low. This is taken care of as follows.

The excess input voltage applied to the input/output terminal 12, usually in pulse form, is discharged by the breakdown of the first protective element (diode) 14 having a high surge capacity. The breakdown voltage $V_{b1}$ of the diode is transferred through the C-R network of the resistance $R_1$ of the diffusion region 38 and its parasitic capacitance $C_1$ to ground. The transferred voltage is dumped to a lower level $V_2$ which is applied to the second protection element 15, namely the lateral transistor. If this voltage $V_2$ is higher than the breakdown voltage $V_{b2}$ of the lateral transistor 15, the transistor 15 will break down, but will not burn out because the transferred energy has been sufficiently reduced. Of course, the breakdown voltage $V_{b2}$ is selected to a sufficiently low value to protect the gate insulator 33 of the FET 13 from breakdown.

In the above, a protection circuit for the input circuit 11 of FIGS. 1 and 2 has been described, but this invention is also applicable to the output circuit 21, also shown in FIG. 1. Namely, a first protection element 26 having a deep diffusion region 22, the second protection element 24, and a lateral transistor, having shallow diffusion regions 23, are formed on the substrate 10. The depth of the diffusion regions 22 and 23 are selected respectively to be larger and almost equal to or smaller than that of the diffusion regions of the inner elements in the output circuit (not shown in the figure). The action and effect of the circuit are the same as that of the input circuit 11, so further description is omitted.

The lower half of FIG. 1 shows that the shallow region 23 of the lateral transistor 24, on the output of an inner element to be protected, can also be the drain of an inner element.

Again, the depth of the diffusion region of the second elements can be selected to be smaller than that of the inner elements.

Next, the method for fabricating the input circuit 11 including the protection circuit shown in FIG. 1 will be described, referring to FIGS. 3(a) to (f) showing respective fabrication steps. Each of these figures illustrates schematically an enlarged partial cross-sectional view.

A p-type monocrystalline silicon substrate 10 has a doping density in the range of approximately $6.5 \times 10^{14}$ atm/cm$^3$. The fabrication begins with the selective p+ ion-implanting at around $1.2 \times 10^{13}$ atm/cm$^2$ for providing the channel-cut regions 32. The field oxide layers 31 (silicon dioxide, SiO$_2$) are formed using conventional LOCOS (Local Oxidation of Silicon). That is, the formation of the field oxide layer 31 is performed by a conventional thermal oxidizing method, and a masking pattern of silicon nitride (Si$_3$N$_4$) film is formed using conventional photolithographic technology. During this process, the selectively ion-implanted p+ dopant is diffused to form the channel-cut layer 32 with a thickness of 0.5 to 0.6 μm beneath the field oxide layer 31.

Figure 3A:
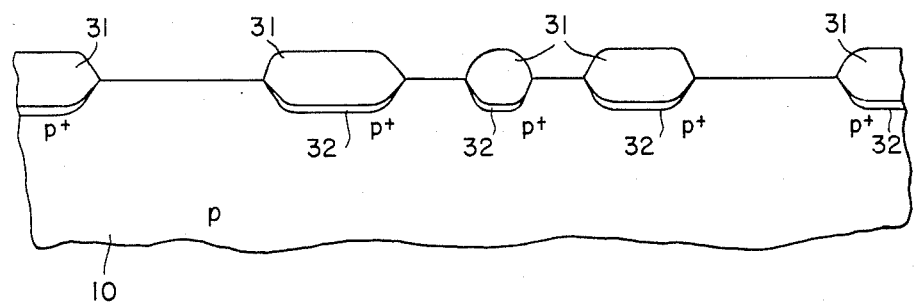
FIGS. 3(a) to (f) illustrate schematically the cross-sectional structure of a semiconductor device shown in FIG. 1, at respective steps of its fabrication process.
Figure 3B:
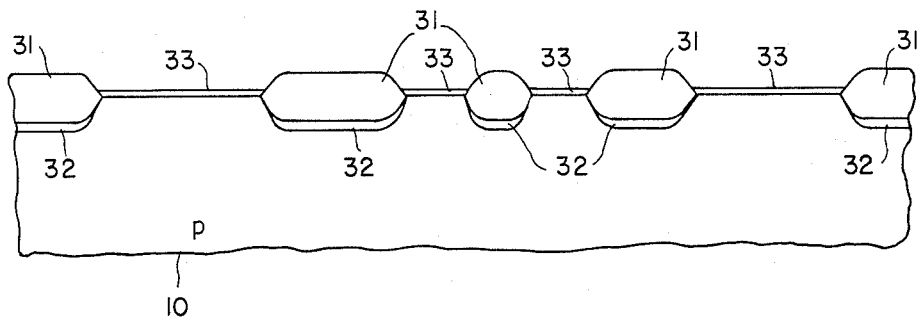
Figure 3C:
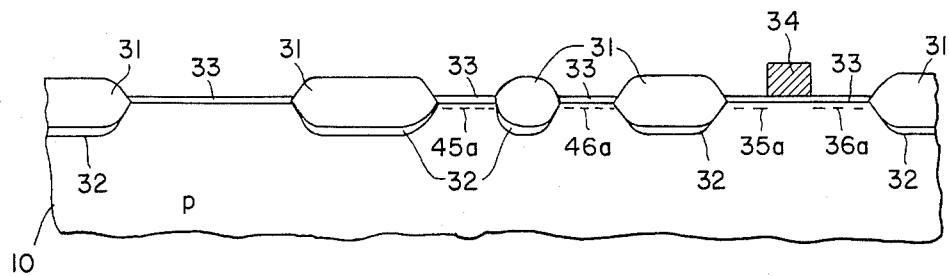

After the field oxide layers 31 are grown, as shown in FIG. 3(b), another silicon oxide layer 33 having a thickness of approximately 400 to 500 Å is formed over the substrate 10 including over the field oxide layer 31. This layer subsequently provides the gate oxide layer as shown in FIG. 3(c). This step is followed by the formation of a conductive polycrystalline silicon layer having a thickness of 4000 to 5000 Å and a sheet resistance of 30 Ω/cm$^2$. This layer is formed by conventional chemical vapor deposition (CVD) method and is heavily doped with n-type dopant (phosphorus, for instance).

Next, the n-type polycrystalline silicon layer is etched off, leaving the silicon gate electrode 34 as shown in FIG. 3(c), using a silicon gate mask formed by a conventional photolithographic technology. The silicon dioxide layer 33 is temporarily left for protecting the surface.

Next are formed the source region 35 and drain region 36 for the field effect transistor 13, and the collector region 45 and the emitter region 46 for the lateral transistor 15. These regions are defined by the field oxide layers 31 and the gate electrode 34. In the ion-implanting process, the device is exposed to an arsenic ion beam with an accelerating energy of about 120 Kev and a high dose of $4 \times 10^{15}$ atm/cm$^2$, for example. The dopant penetrates through the silicon dioxide layer 33 and into the substrate 10 to form thin layers 35a, 36a, 45a and 46a of concentrated n+ type dopants shown by dotted lines in the figure. The fabricating steps described above are conventional processes for the fabrication of ordinary ICs.

Figure 3D:
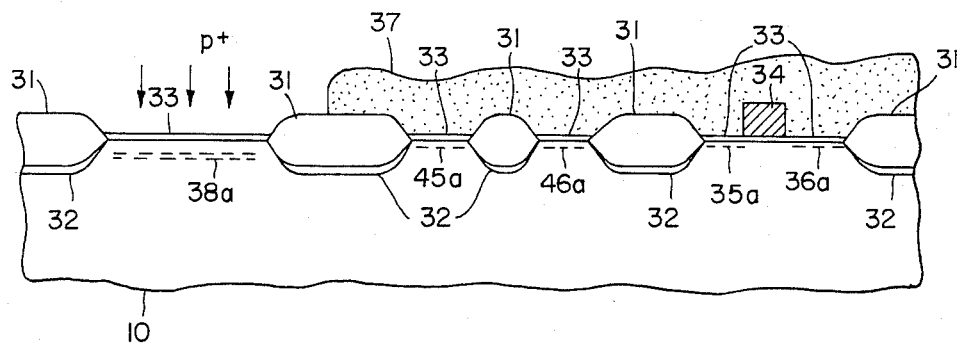
Figure 3E:
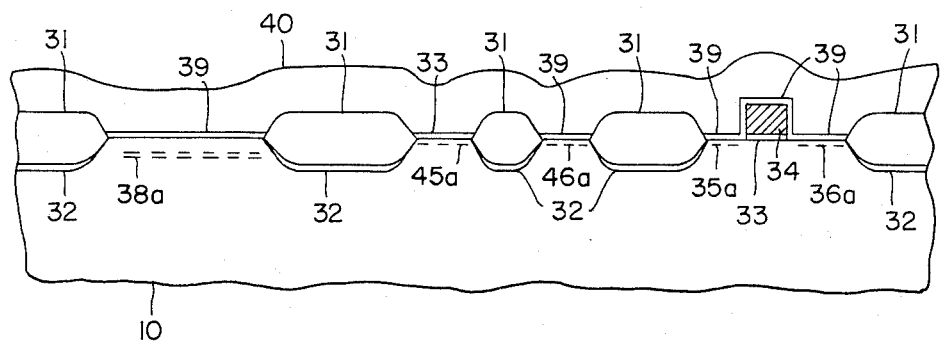

Now the first protective element 14 for the protection circuit, having a deeper impurity diffusion region according to the present invention, is started. The entire surface of the device is covered by a photoresist layer 37, and a window is opened on the portion where the first protective element 14 is to be formed, using conventional photolithographic technology. As shown in FIG. 3(d), phosphorus ions (P+) at $10^{15}$ atm/cm$^2$ are ion-implanted through the window, and the silicon dioxide layer 33 into the substrate 10, and a phosphorus concentrated layer 38a (denoted by the dotted line) is formed.

After that, the photoresist layer 37 is removed and the silicon dioxide layer 33 is etched away and removed, except underneath the gate electrode 34. Following this step, a blocking oxide layer 39 of silicon dioxide (SiO$_2$) is newly formed, covering the surface of the device. The blocking oxide layer 39 prevents the phosphorus contained in the phosphorus silicate glass (PSG) from diffusing in subsequent steps into various diffusion regions, such as the source region 35, drain region 36, etc. On the blocking oxide layer 39, a PSG layer 40 is formed covering all the surface. Windows for the contact holes to the already-formed diffusion regions are opened by a conventional photolithographic method, and this is followed by a heat treatment at around 1050° C. in a furnace. The PSG layer is softened (half remelted) at this temperature, and the edge of the windows are accordingly rounded to prevent the breaking of an interconnecting layer to be formed on the edge. With this heat treatment, the concentrated phosphorus (p+) dopant in the portion 38a is diffused into the substrate 10 to form a diffusion region 38 of about 0.8 μm in depth. At the same time, the concentrated arsenic (As+) dopant is diffused to form the source diffusion region 35 and the drain diffusion region 36 of the FET 44, and the collector region 45 and emitter region 46 of the lateral transistor 15, namely, of the second protective element. Since phosphorus has a higher diffusion coefficient than arsenic in a silicon substrate, the diffusion region 38 has a depth of about 0.4 μm which is much shallower than that of the diffusion region 32. Thus, the deeper diffusion region 38 is formed to provide the first protective element (to be subsequently completed) with a high surge capacity for the input voltage. The depth of the diffused region can be controlled by other methods such as the diffusion temperature or the dopant density as concentrated beforehand.

Figure 3F:
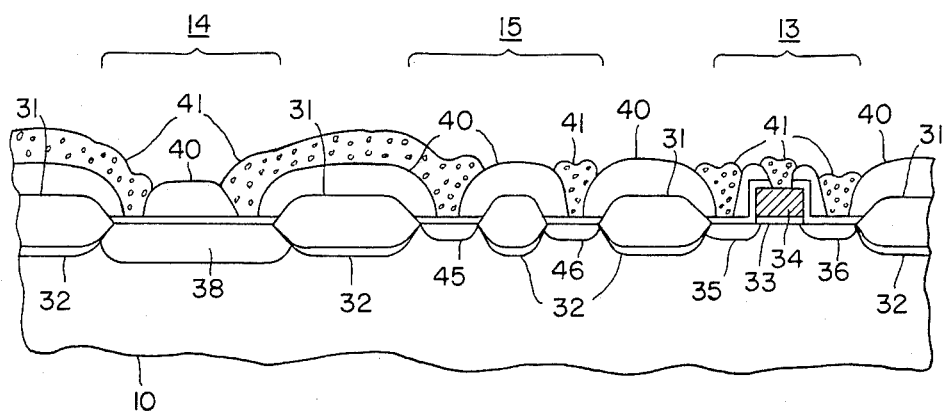

After the formation of the diffusion regions, as shown in FIG. 3(f), a conducting layer such as an aluminum layer is deposited, and connected to the diffusion regions through windows already formed in PSG layer 40. By conventional photolithographic technology, the conducting layer, namely the aluminum layer, is patterned to form the specified interconnecting layer 41, and finally a protecting layer of PSG is formed having openings for the input/output bonding pads (not shown in the figures). The detailed description of the fabricating steps, subsequent to the steps shown in FIG. 3(f), are omitted because they are not the focus of this invention.

In the similar way, the fabrication of a protection circuit for the output circuit 21 of FIG. 1 can be formed. In the example described above, the terminal is for output/input use, but the present invention is also applicable to an IC device having separate input and output terminals.

For evaluating the effect of the protection circuit according to the present invention, an experiment was conducted for comparison with a prior art structure. The testing energy stored up in a condenser of 200 pF capacitance at various DC testing voltages was applied to the input or output terminal of the IC device to be tested. The applied voltage started from a lower voltage, and was raised gradually until the IC device under test was damaged. The conditions and results are shown in Table 1.

TABLE 1

| | prior art | present invention |
|---|---|---|
| diffusion region depth of FET | 0.4 μm | 0.4 μm |
| gate insulator thickness of FET | 400Å | 400Å |
| breakdown voltage of gate | 30 V (DC) | 30 V (DC) |
| diffusion region depth of (second) protective element | 0.4 μm | 0.4 μm |
| breakdown voltage of ditto | 30 V (DC) | 30 V (DC) |
| diffusion region depth of first protective element | none | 0.6 to 0.7 μm |
| breakdown voltage of ditto | none | 35–36 V (DC) |

The prior art IC device withstood around 200 volts, while the improved IC device could withstand around 350 volts, thus demonstrating remarkable progress in the ability to withstand excess input energy. Accordingly, it can be concluded that the present invention provides semiconductor devices with significant improvement in their field reliability.

I claim:

1. A semiconductor device including a semiconductor substrate of a first conductivity type, at least one terminal for providing at least one of input and output signals, a protection circuit and an inner element, said protection circuit comprising:

a first protective element comprising a diode having a first impurity region of a second conductivity type opposite to said first conductivity type of said substrate, a first end of said first impurity region being connected to said terminal; and a second protective element comprising a lateral bipolar transistor having a collector region and an emitter region, both of said collector and emitter regions having the second conductivity type, being formed in said substrate, being arranged to but separate from each other so as to define a base region in said substrate, and being shallower than said first impurity region, a first end of said collector region being connected to a second end of said first impurity region that is spaced from said first end thereof, a second end of said collector region being connected to said inner element, and said emitter region being electrically connected to ground;

wherein said terminal, said first protective element, said second protective element and said inner element are operatively connected in series in the recited order, and said first protective element has a higher surge capacity and higher junction breakdown voltage than that of said second protective element as a result of said first impurity region and said collector region;

so that a protection voltage corresponding to said at least one of said input and output signals is provided by said protection circuit to said inner element.

2. The device of claim 1, wherein a first conductive means connects from said first end of said first impurity region to said terminal, and a second conductive means connects said second end of said first impurity region to said first end of said second protective element, so that the respective resistance of said first impurity region between said first and second ends thereof is in series between said terminal and said second protective element.

3. The device of claim 1, or 2, wherein said first protective element removes excess energy from said input signals provided at said terminal, and said second protective element limits the value of said protection voltage supplied to said inner element in correspondence to said input signal.

4. The device of claim 1, or 2, wherein said terminal is for a predetermined one of said input signals along and of the combination of said input signals and output signals.

5. The device of claim 4, said terminal being for the combination of input and output signals, wherein respective input and output circuits each comprise respective ones of said series-connected first and second protective elements and inner circuit connected to said at least one terminal.

6. The device of claim 1, wherein said inner element is protected from a surge of 350 volts on said at least one of said input and output signals.

7. The device of claim 6, said junction breakdown voltage of said first protective element being approximately 5 volts higher than that of said second protective element.

8. The device of claim 7, said junction breakdown voltage of said first protective element being approximately 35 volts.

9. The device of claim 1, wherein said collector region of said second protective element is connected to the same potential as said substrate.

10. The device of claim 1, said inner element having an impurity region of said seond conductivity type in said substrate, of the same depth as said second and third impurity regions of said second protective element.

11. The device of claim 6, said inner element having an impurity region of said second condutivity type in said substrate, of the same depth as said collector and emitter regions of said second protective element.

12. The device of claim 9, said inner element having an impurity region of said second conductivity type in said substrate, of the same depth as said collector and emitter regions of said second protective element.

13. The device of claim 1, said collector region comprising a drain of a transistor of said inner element.

14. The device of claim 1, wherein said first protective element prevents destructive burn-out of said second protective element.

15. The device of claim 1, said inner element having an impurity region of said second conductivity type in said substrate, wherein said collector and emitter regions of said second protective element are respectively selected to be larger and smaller than said impurity region of said inner element.

* * * * *

UNITED STATES PATENT AND TRADEMARK OFFICE
CERTIFICATE OF CORRECTION

PATENT NO. : 4,720,737

DATED : January 19, 1988

INVENTOR(S) : Takehide Shirato

It is certified that error appears in the above-identified patent and that said Letters Patent is hereby corrected as shown below:

Column 8, line 47, "along" should be -- alone --.

Column 9, line 2, "seond" should be -- second --.

Signed and Sealed this

Nineteenth Day of July, 1988

Attest:

DONALD J. QUIGG

Attesting Officer     Commissioner of Patents and Trademarks